United States Patent [19]

Lomerson

[11] 4,183,137
[45] Jan. 15, 1980

[54] METHOD FOR METALIZING HOLES IN INSULATION MATERIAL

[76] Inventor: Robert B. Lomerson, Rte. 9, Box 196, Fort Worth, Tex. 76179

[21] Appl. No.: 768,736

[22] Filed: Feb. 15, 1977

[51] Int. Cl.² .......................... B41M 3/08; H05K 3/00
[52] U.S. Cl. ........................................ 29/625; 427/11; 427/97; 427/123; 427/181; 427/191; 427/264; 427/275; 427/290; 427/357; 427/367; 427/369
[58] Field of Search .................. 427/97, 289, 290, 275, 427/11, 264, 123, 191, 181, 357, 367, 369; 29/625, 626

[56] References Cited

U.S. PATENT DOCUMENTS

| | | | |
|---|---|---|---|
| 3,158,503 | 11/1964 | Young | 427/97 |
| 3,268,653 | 8/1966 | McNutt | 174/68.5 |
| 3,357,856 | 12/1967 | Ragan et al. | 427/97 |
| 3,391,455 | 7/1968 | Hirohata et al. | 427/97 |
| 3,416,958 | 12/1968 | Oxford | 427/97 |
| 3,562,009 | 2/1971 | Cranston et al. | 427/97 |
| 3,576,669 | 4/1971 | Filip | 427/97 |

FOREIGN PATENT DOCUMENTS 1243 of 1856 United Kingdom ................... 427/11

Primary Examiner—Michael F. Esposito
Assistant Examiner—Sadie L. Childs
Attorney, Agent, or Firm—Richards, Harris & Medlock

[57] ABSTRACT

A method for metalizing the surface walls of a printed circuit board through hole to produce an electrically conductive path from one metallic layer of the board through the insulating plate to another metallic layer. A drill bit is forced through the board and into a block of soft conductor material. While the bit is turning the conductive cuttings from the block are carried to the hole in the insulating plate and smeared on the wall surface by the bit. The smeared conductive material creates an electrically conductive path between two metallic layers of the printed circuit board.

11 Claims, 2 Drawing Figures

METHOD FOR METALIZING HOLES IN INSULATION MATERIAL

FIELD OF THE INVENTION

This invention relates to the manufacture of electronic circuit boards and more particularly to the metalizing of holes to form a conducting path through circuit boards.

BACKGROUND OF THE INVENTION

In the prior art to produce a through-the-board conducting path in a printed circuit board having layers of copper on both sides, the board is first passed through a drilling operation wherein all of the holes to be utilized as conductive holes through the board are drilled. Thereafter, a series of steps are taken in which a heavy layer of copper is ultimately deposited on the walls of each of the holes. This is done by first subjecting it to a catalyst seeding operation wherein microdeposits of metal are placed on the walls of each of the holes. Thereafter, copper is plated out onto the walls of the holes. After all of the holes have thus been plated, the printed circuit pattern is laid out on the two sides of the board and the copper is etched leaving the lead path intact. Thereafter the components are mounted on the circuit board and a soldering step completes the task of securing the component to the board. The holes containing leads to the components are then filled with solder.

In U.S. Pat. No. 3,576,669 the walls of a through hole are coated by passing a rod through the hole and immersing the rod in a liquid metal mixture. The liquid metal adheres to the rod and as the rod is withdrawn from the circuit board the liquid metal is coated onto the walls of the hole. The liquid metal then hardens at room temperature and produces a conducting path between the two sides of the circuit board.

SUMMARY OF THE INVENTION

The present invention eliminates many of the foregoing steps. The copper-clad circuit board may be drilled and etched with these operations occuring in any order. The chemical baths and metal deposition steps are minimized. The drilling operation itself results in the hole surfaces being wiped with conductive cuttings to cover the entire surface with a conductive layer.

Thereafter the components may be mounted onto the board and wave soldered to fill the holes with solder. The soldering operation is enhanced and made possible at the sites of the holes by reason of the metal coating on the inner walls of the holes.

More specifically, this invention relates to a method of establishing a conductive connection through holes in an insulating plate by forcing a drill bit through the plate at the site of each of the holes and at the same time contacting the bit with a body of conductive material which is mechanically spreadable by the bit onto the walls of the holes. In addition, it relates to a method of establishing a conductive connection along the surface of an insulating plate by cutting a groove in the surface of the plate with a circular saw blade while at the same time contacting the blade with a body of conductive material which is mechanically spreadable by the blade onto the walls of the groove.

BRIEF DESCRIPTION OF THE DRAWINGS

The novel features believed characteristic of the invention are set forth in the appended claims. The invention itself, however, as well as further objects and advantages thereof, will best be understood by reference to the following detailed description of an illustrative embodiment taken in conjunction with the accompanying drawings in which:

DETAILED DESCRIPTION

Figure 1:
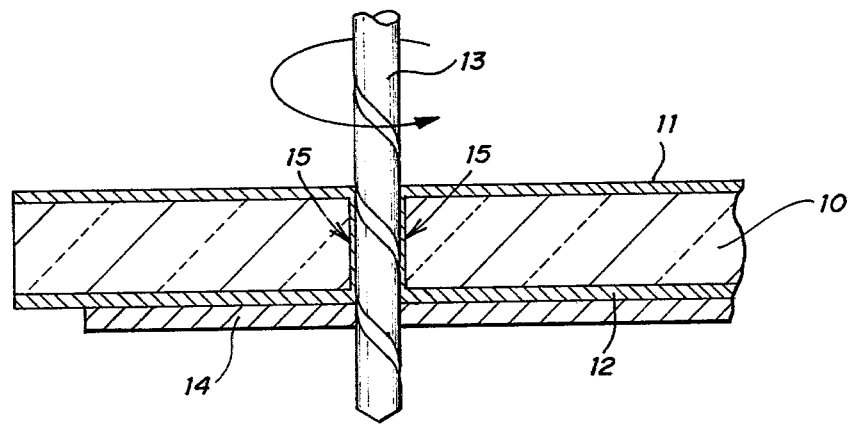
FIG. 1 is a side view of a drill bit, printed circuit board and conductive material plate.

Referring now to FIG. 1 drill bit 13 is passed through a printed circuit board consisting of copper layer 11, insulating block 10, copper layer 12, and through conductive material block 14. Conductive layer 15 is smeared onto the wall surface of the hole by the turning of drill bit 13.

Figure 2:
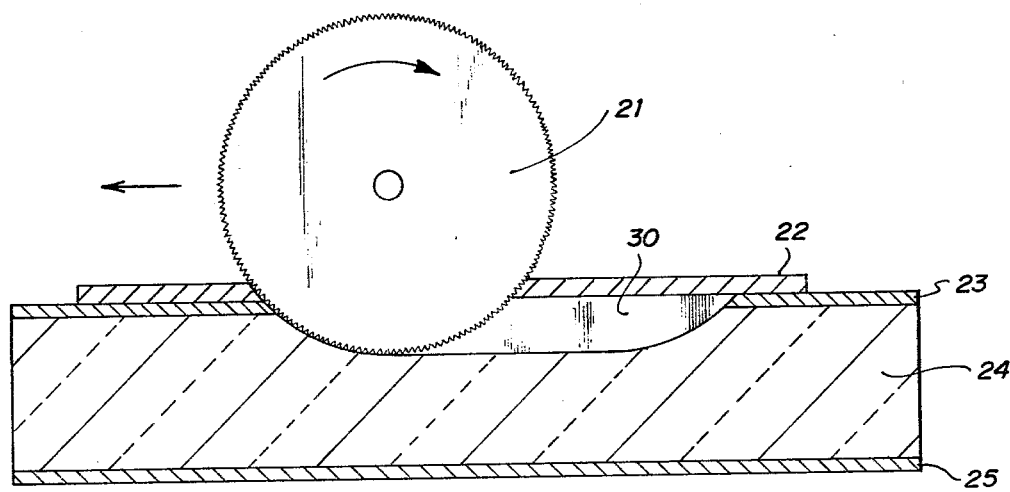
FIG. 2 is a side view of circular saw blade, a printed circuit board and a conductive material plate.

Referring now to FIG. 2 circular saw 21 is cut through conductive material block 22, copper layer 23 and insulating plate 24. The cuttings from conductive material block 22 are smeared onto the walls of plate 24 creating a conductive surface 30.

In operation, referring to FIG. 1, the drill bit 13 is forced through the printed circuit board layers 10, 11 and 12, and then into contact with the conductive material block 14. Upon contacting the conductive material, cuttings are produced which are carried upward by the drill bit. These conductive material cuttings are carried into the hole in the printed circuit board and are smeared onto the surface walls of the hole by the turning of the drill bit. The tendency of the drill bit to propel the cuttings upward results in the coating of the entire surface of the hole with the conductive material. The drill bit is then withdrawn leaving a layer of conductive material which has been smeared on the surface of the hole walls. The smeared conductive surface is in contact with both of the metal layers of the printed circuit board thus establishing an electrically conductive path between the two layers.

Similarly, in FIG. 2, as saw blade 21 cuts through conductive material block 22, copper layer 23 and insulating plate 24, a groove is cut along the surface of the printed circuit board. The cuttings from the conductive material block 22 are carried along by saw 21 into the groove. These cuttings are then smeared by the blade onto the groove walls of the insulating plate. This conductive surface 30 is in contact with copper layer 23. Thus grooves can be cut in the surface of the printed circuit board to establish electrically conductive paths from one point to another.

In like fashion saw blade 21 could cut completely through plate 24 and copper layer 25 to establish a conductive path from one side of the printed circuit board to another.

The formation of the layer of conductive material on the walls of the holes is not fully understood. In the case of an indium alloy, it is known that indium will wet insulating materials such as glass epoxy. Because of this property, indium alloys are used to bond to glass and epoxy. Using an indium alloy in accordance with the present invention may therefore depend upon the affinity of the indium itself to an insulator, and its compatibility with conventional solders permits its use for the present purpose. In such case, the alloy may not need to be worked to a melting temperature in order to establish the layer.

In other metals of low melting point but not indium alloys and thus not of the type which will wet glass or epoxy, the layer of such metal is spread onto the walls of the hole by the mechanical working of the bit such that the melting temperature or near melting temperature is approached in which state the layer of conductive material is smeared or frictionally applied onto the hole walls.

In accordance with the present invention, either type of conductive material can be used. In one case, an indium-tin alloy (50—50) was found to be suitable. In another case, a bismuth, cadmium tin and lead alloy was employed (50%, 10%, 13.3%, 26.7%).

In one instance, a drill bit forming the hole was passed through the insulating board and into an adjacent underlying layer of the desired alloy. The cuttings from the underlying layer drawn through the hole in the insulating board were then effectively wiped onto the hole walls to coat the same.

In another operation, the same effect was produced by passing the drill bit first through a layer of the coating material and then through the insulating board.

It will be understood that while copper clad insulating circuit boards are generally employed and are desired because of the ability to solder to copper, other circuit board metals may be employed. For example, aluminum may be employed as the basic conductor on the face of the circuit boards. In such case, a metal would be used to coat the holes which is compatible with aluminum. A low melting point fusable indium alloy is suitable for such arrangement.

Further, in some instances it may be desirable to utilize the fusable alloy as the plating on the circuit board itself so that after the plating has been etched to form the desired circuit paths, holes drilled through the low melting point metal forming the circuit paths and thence through the circuit board and into a similar path on the other side of the circuit board would automatically result in the coating of the hole. This would be done without utilization of a separate layer of material for supplying the coating metal.

Various types of cutting tools can be employed to cut the insulating plate and the plate can be cut in various ways. The plate can be drilled to form a conductor from one surface to another, a groove can be cut through the plate to connect two points on one surface or the groove can cut through the plate to connect both surfaces. Thus, the term "through" means any geometry of cutting of the insulating plate to form a conductive path.

The embodiment of this invention previously described used the spreadable and conductive material in block form but the invention is not limited to this form. The conductive material can also be used in subdivided forms such as cuttings or powder.

While embodiments of the invention have been described in detail, modifications and alterations may occur to others upon a reading and understanding of the specification. It is intended to include all such modifications and alterations as fall within the scope of the appended claims.

What is claimed is:

1. A method for establishing an electrically conductive path on the surface of a passage through a non-conductive body which comprises forcing a mechanically spreadable and electrically conductive material as a solid in subdivided form into frictional contact with the walls of said passage to deposit a continuous layer of said material on said walls, said layer adherent to said body to form said conductive path.

2. A method for establishing an electrically conductive path on the surface of a passage through a non-conductive body as recited in claim 1 which includes plating a conductive metal onto the surface of said layer of said material.

3. A method for establishing an electrically conductive path through a non-conductive body, comprising the steps of:
    (a) forming a passage through said non-conductive body,
    (b) introducing into said passage metallic cuttings which are mechanically spreadable onto said body and are electrically conductive,
    (c) pressing said metallic cuttings against the wall of said passage by means of a tool moving in respect to said wall to form a continuous, electrically conductive layer thereon.

4. A method for establishing an electrically conductive path as recited in claim 3 further including the step of working a metal plate to produce said metallic cuttings.

5. A method for establishing an electrically conductive path as recited in claim 3 further including the step of plating a second conductive metal onto the surface of said electrically conductive layer.

6. A method for establishing an electrically conductive path through a non-conductive member, comprising the steps of:
    (a) passing a cutting tool through said member to produce a passage therein;
    (b) contacting said cutting tool with a body of mechanically spreadable and electrically conductive metal to produce metallic cuttings therefrom;
    (c) transporting said metallic cuttings by means of said cutting tool into said passage; and
    (d) smearing said metallic cuttings onto the walls of said passage by means of said cutting tool to form a continuous, electrically conductive layer on the walls of said passage.

7. A method for establishing an electrically conductive path as recited in claim 6 further including the step of plating a second conductive metal onto the surface of said electrically conductive layer.

8. A method for establishing an electrically conductive path through a non-conductive body, comprising the steps of:
    (a) forming a passage through said non-conductive body;
    (b) introducing into said passage a low melting point conductive metal which is in a subdivided state;
    (c) frictionally heating said metal by contact between a tool moving in respect to said body and the wall of said passage so as to melt said metal; and
    (d) forming a continuous conductive layer comprising said metal on the wall of said passageway.

9. A method for establishing an electrically conductive path as recited in claim 8 further including the step of plating a second conductive metal onto the surface of said conductive layer.

10. A method for establishing an electrically conductive path as recited in claim 6 wherein said cutting tool comprises a drill bit.

11. A method for establishing an electrically conductive path as recited in claim 6 wherein said cutting tool comprises a circular saw blade.

* * * * *